United States Patent
Magri' et al.

(10) Patent No.: US 6,326,271 B2
(45) Date of Patent: *Dec. 4, 2001

(54) ASYMMETRIC MOS TECHNOLOGY POWER DEVICE

(75) Inventors: Angelo Magri', Belpasso; Raffaele Zambrano, Viagrande; Ferruccio Frisina, Sant'Agata Li Battiati, all of (IT)

(73) Assignee: SGS-Thomson Microelectronics S.r.l., Agrate Brianza (IT)

( * ) Notice: Subject to any disclaimer, the term of this patent is extended or adjusted under 35 U.S.C. 154(b) by 0 days.

This patent is subject to a terminal disclaimer.

(21) Appl. No.: 09/746,789

(22) Filed: Dec. 21, 2000

Related U.S. Application Data

(62) Division of application No. 08/886,836, filed on Jul. 1, 1997.

(30) Foreign Application Priority Data

Jul. 5, 1996 (EP) .................................. 96830384

(51) Int. Cl.⁷ .................................................. H01L 21/336
(52) U.S. Cl. ............................................ 438/289; 438/290
(58) Field of Search ................... 438/289, 290, 438/291, 138, 273, 137, 149–156, 163, 170, 197; 257/634, 124, 341, 383, 296, 384, 145, 138, 401, 139–147

(56) References Cited

U.S. PATENT DOCUMENTS

| | | | |
|---|---|---|---|
| 4,069,067 | * | 1/1978 | Ichinohe ................................ 438/301 |
| 4,412,242 | | 10/1983 | Herman et al. . |
| 4,417,385 | | 11/1983 | Temple . |

(List continued on next page.)

FOREIGN PATENT DOCUMENTS

| | | | |
|---|---|---|---|
| A-43 01 947 | 8/1993 | (DE) | .............................. H01L/29/72 |
| A-0 405 138 | 1/1991 | (EP) | .............................. H01L/29/72 |
| A-0 561 267 | 9/1993 | (EP) | .............................. H01L/29/73 |

OTHER PUBLICATIONS

European Search Report from European Patent Application 96830384.2, filed Jul. 5, 1996.

(List continued on next page.)

Primary Examiner—David Nelms
Assistant Examiner—Thao P. Le
(74) Attorney, Agent, or Firm—Wolf, Greenfield & Sacks, P.C.; James H. Morris; Theodore E. Galanthay

(57) ABSTRACT

A MOS technology power device comprises a semiconductor substrate, a semiconductor layer of a first conductivity type superimposed over the semiconductor substrate, an insulated gate layer covering the semiconductor layer, a plurality of substantially rectilinear elongated openings parallel to each other in the insulated gate layer, a respective plurality of elongated body stripes of a second conductivity type formed in the semiconductor layer under the elongated openings, source regions of the first conductivity type included in the body stripes and a metal layer covering the insulated gate layer and contacting the body stripes and the source regions through the elongated openings. Each body stripe comprises first portions substantially aligned with a first edge of the respective elongated opening and extending under a second edge of the elongated opening to form a channel region, each first portion including a source region extending substantially from a longitudinal axis of symmetry of the respective elongated opening to the second edge of the elongated opening, and second portions, longitudinally intercalated with the first portions, substantially aligned with the second edge of the elongated opening and extending under the first edge of the elongated opening to form a channel region, each second portion including a source region extending substantially from the longitudinal axis of symmetry to the first edge of the elongated opening, the first portions and second portions of the body stripes being respectively aligned in a direction transversal to the longitudinal axis.

8 Claims, 12 Drawing Sheets

U.S. PATENT DOCUMENTS

| | | |
|---|---|---|
| 4,816,882 | 3/1989 | Blanchard et al. . |
| 4,893,165 | 1/1990 | Miller et al. . |
| 4,916,509 | 4/1990 | Blanchard et al. . |
| 4,920,388 | 4/1990 | Blanchard et al. . |
| 4,920,393 * | 4/1990 | Kawakami et al. ................ 257/401 |
| 4,975,782 | 12/1990 | Bauer . |
| 4,985,740 | 1/1991 | Shenai . |
| 4,998,151 | 3/1991 | Korman et al. . |
| 5,047,833 | 9/1991 | Gould . |
| 5,119,153 | 6/1992 | Korman et al. . |
| 5,194,929 | 3/1993 | Ohshima et al. . |
| 5,234,851 | 8/1993 | Korman et al. . |
| 5,248,891 | 9/1993 | Takato et al. . |
| 5,319,222 | 6/1994 | Shekar et al. ................ 257/139 |
| 5,321,295 | 6/1994 | Hisamoto ................ 257/401 |
| 5,323,059 | 6/1994 | Rutter et al. . |
| 5,404,040 | 4/1995 | Hshieh et al. . |
| 5,444,271 | 8/1995 | Kuwahara . |
| 5,486,715 | 1/1996 | Zommer . |
| 5,521,409 | 5/1996 | Hshieh et al. . |
| 5,883,412 | 3/1999 | Ferla et al. . |

OTHER PUBLICATIONS

Thapar N., et al., "A comparison Of High Frequency Cell Designs For High Voltage DMOSFETs", Proceedings Of The 6th International Symposium On Power Semiconductor Devices and ICS. ISPSD '94 Proceedings of ISPSD '94 International Symposium on Power Semiconductor Devices and IC's Switzerland, May 31—Jun. 2, 1994, Konstanz, Germany, Hartung–Gorre Verlag, Germany, pp. 131–135.

* cited by examiner

ASYMMETRIC MOS TECHNOLOGY POWER DEVICE

This application is a division of Ser. No. 08/886,836 filed Jul. 1, 1997.

BACKGROUND OF THE INVENTION

1. Field of the Invention

The present invention relates to a MOS technology power device, particularly a power MOSFET or an Insulated Gate Bipolar Transistor (IGBT).

2. Discussion of the Related Art

Among the most important electric parameters which characterize power MOS devices are the output resistance ($R_{DSon}$), the input capacitance (gate-source capacitance or gate-emitter capacitance) and the feedback capacitance (gate-drain capacitance or gate-collector capacitance).

The output resistance is important during steady-state conditions because the output resistance determines the power dissipation of the power device, and should therefore be as small as possible.

The input and feedback capacitances are instead important during switching because the capacitances determine the turn-on and turn-off time of the power device. Longer turn-on and turn-off times cause a higher power dissipation during switching and limit the operating frequency of the power device.

In order to reduce the input and feedback capacitances, it is necessary to increase the gate oxide thickness and/or to reduce the extension of the area of superposition between the gate electrode, the channel region and the drain layer.

Unfortunately, an increase in gate oxide thickness or reduction in the area of superposition negatively affects the steady-state characteristics of the power device, such as the output resistance. In fact, an increase of the gate oxide thickness would cause an increase of the channel region and accumulation components of the output resistance. A reduction of the distance between the body regions of the elementary cells (or stripes) of the power device in an attempt to reduce the superposition area between the gate electrode and the drain layer would cause an increase of the so-called JFET component of the output resistance.

Conventionally, the distance between the elementary cells or stripes of the power device depends on the lateral diffusion of the body regions and on the requirement that the JFET component of the output resistance is to be kept low. For example, in power devices for low-voltage applications the distance between the elementary cells or stripes of the power device cannot be lower than 5–6 µm.

In the co-pending European Patent Application No. 95830453.7 filed on Oct. 30, 1995 in the name of the same Applicant, a high-density MOS technology power device is described comprising rectilinear elongated apertures in the insulated gate layer under which rectilinear elongated P type body stripes are formed in an N-drain layer. The body stripes extend laterally under the insulated gate layer symmetrically with respect to the symmetry axes of the elongated apertures in the insulated gate layer. Inside each body stripe, a plurality of N+ source regions are formed which are disposed in longitudinal succession on opposite sides with respect to a symmetry axis of the body stripe. In this way, it is possible to reduce the distance between adjacent elongated apertures in the insulated gate layer without increasing the JFET component of the output resistance, because the portions of the drain layer positioned between adjacent body stripes experience a current flux from only one side. Device simulations have in fact proved that the output resistance depends on the current density in the portions of the drain layer comprised between adjacent body stripes: an asymmetric current flux allows therefore a reduction of the distance between the body stripes without increasing the output resistance.

However, even in this power device structure the distance between adjacent elongated apertures in the insulated gate layer cannot be reduced significantly because of the symmetrical lateral diffusion of the body stripes under the insulated gate layer.

In view of the state of the art described, it is an object of the present invention to provide a MOS technology power device structure which allows for the reduction of the input and feedback capacitances without an increase in the output resistance.

SUMMARY OF THE INVENTION

According to one embodiment the present invention, this and other objects are attained by a MOS technology power device comprising a semiconductor substrate, a semiconductor layer of a first conductivity type superimposed over the semiconductor substrate, an insulated gate layer covering the semiconductor layer, a plurality of substantially rectilinear elongated openings parallel to each other in the insulated gate layer, a respective plurality of elongated body stripes of a second conductivity type formed in the semiconductor layer under the elongated openings, source regions of the first conductivity type included in the body stripes and a metal layer covering the insulated gate layer and contacting the body stripes and the source regions through the elongated openings, characterized in that each body stripe comprises first portions substantially aligned with a first edge of the respective elongated opening and extending under a second edge of the elongated opening to form a channel region, each first portion including a source region extending substantially from a longitudinal axis of symmetry of the respective elongated opening to the second edge of the elongated opening, and second portions, longitudinally intercalated with the first portions, substantially aligned with the second edge of the elongated opening and extending under the first edge of the elongated opening to form a channel region, each second portion including a source region extending substantially from the longitudinal axis of symmetry to the first edge of the elongated opening, the first portions and second portions of the body stripes being respectively aligned in a direction transversal to the longitudinal axis.

In another embodiment of the present invention, the portions of semiconductor layer comprised between adjacent body stripes experience a current flux coming from only one side, and the distance between the body stripes can be reduced without increasing the output resistance of the power device; in addition, due to the fact that the body stripes do not extend symmetrically under the insulated gate layer, the distance between the body stripes can be further reduced.

BRIEF DESCRIPTION OF THE DRAWINGS

These and other features and advantages of the present invention will be made more evident by the following detailed description of some particular embodiments thereof, described as non-limiting examples in the annexed drawings, wherein.

DETAILED DESCRIPTION

Figure 1:
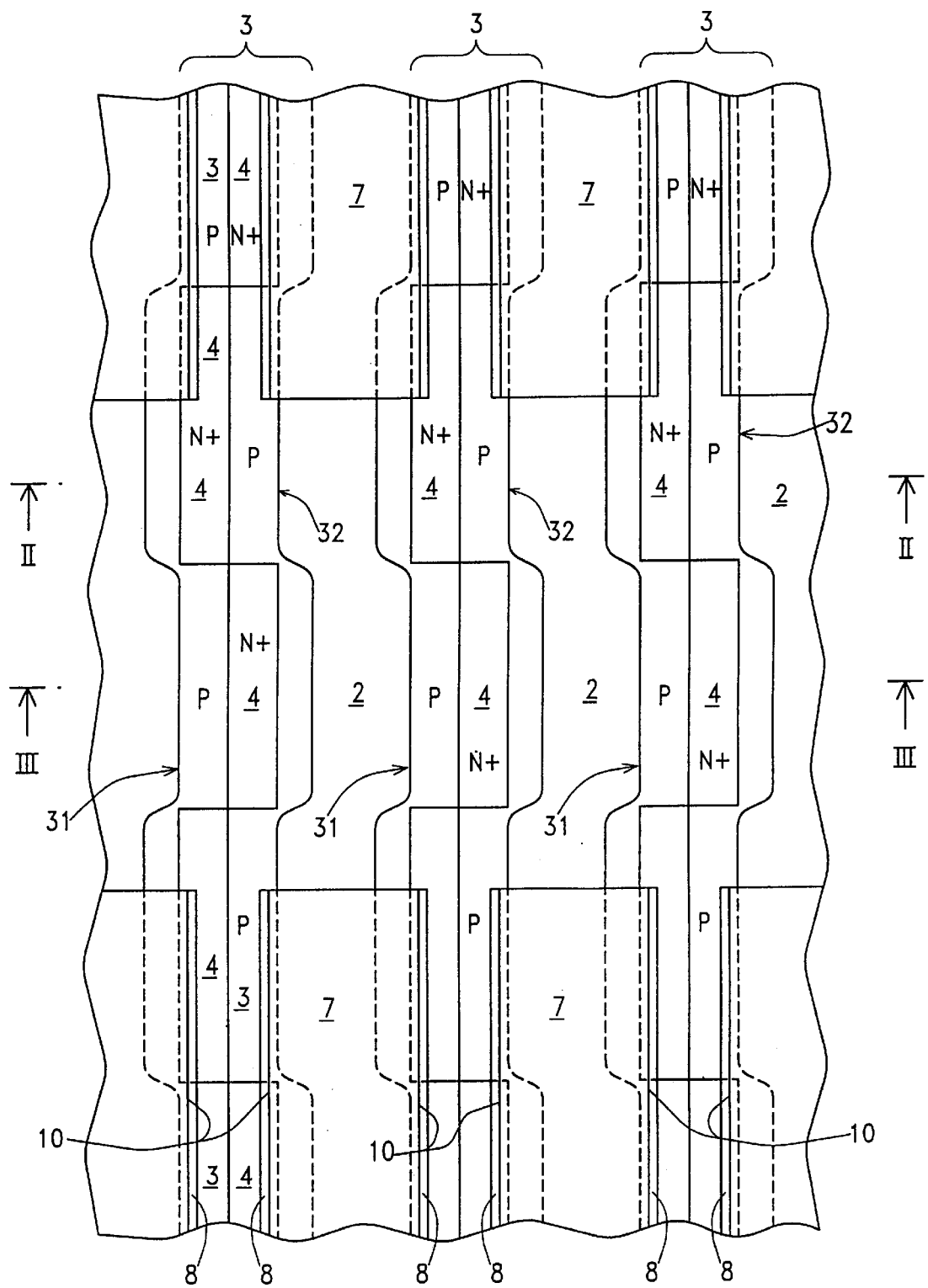
FIG. 1 is a top-plan view of a portion of a MOS technology power device according to a first embodiment of the present invention.
Figure 2:
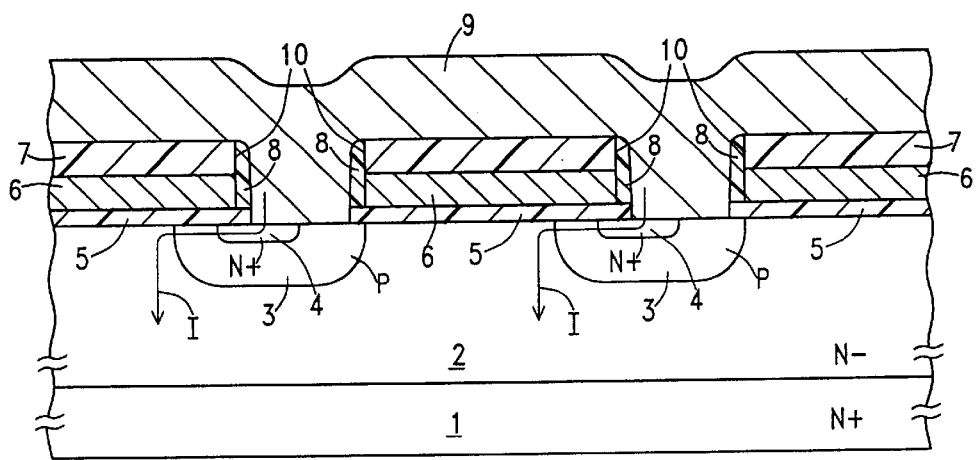
FIGS. 2 and 3 are cross-sectional views taken along lines II—II and III—III of FIG. 1, respectively.
Figure 3:
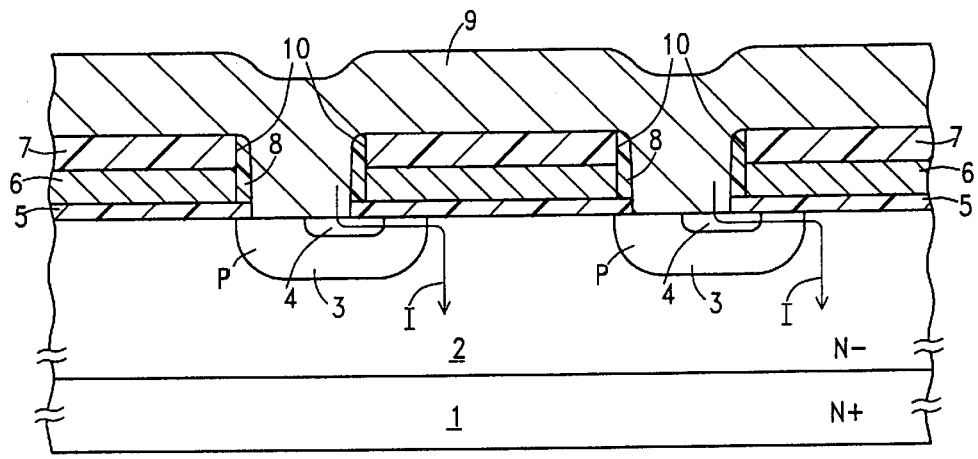

Referring to FIGS. 1, 2 and 3, a portion of a MOS technology power device according to a first embodiment of the invention is shown. The power device comprises a heavily doped silicon substrate 1 over which an N– silicon layer 2 is formed. In the case of a power MOSFET, silicon substrate 1 is N+, while in the case of an Insulated Gate Bipolar Transistor (IGBT), silicon substrate 1 is P+.

An insulated gate layer is disposed over layer 2. The insulated gate layer comprises a gate oxide layer 5, typically $SiO_2$ with thickness of 10 to 100 nm, covered by a conductive gate layer 6, typically of doped polysilicon, in turn covered by an insulating layer 7. It is to be noted that in this embodiment the gate oxide layer 5 has a uniform thickness.

Parallel rectilinear elongated apertures 10 are formed in the insulated gate layer, the vertical walls thereof being sealed by insulating material sidewall spacers 8, typically of $SiO_2$.

P type body stripes 3 are formed in the N– layer 2 under the rectilinear elongated apertures 10 in the insulated gate layer. As visible, the body stripes 3 are not symmetric with respect to the longitudinal symmetry axis of the elongated apertures 10 in the insulated gate layer: the body stripes 3 comprise first portions 31 which at one side extend slightly under, a first wall of the apertures 10 and at the other side extend significantly under the second wall of the apertures 10 to form a channel region, the first portions being longitudinally intercalated with second portions 32 which at one side extend slightly under, the second wall of the apertures 10 and at the other side extend significantly under the first wall of the apertures 10 to form the channel region on the opposite side with respect to the longitudinal axis of the elongated apertures 10.

A plurality of N+ source regions 4 are formed in the body stripes 3 and are disposed in longitudinal succession on opposite sides with respect to the longitudinal axis of the elongated apertures 10. In the first portions 31 of the body stripes 3, the N+ source regions 4 extend substantially from the longitudinal axis of the elongated apertures 10 to the second wall thereof, while in the second portions 32 the source regions 4 extend from the longitudinal axis of the apertures 10 to the first wall thereof.

Adjacent body stripes 3 are formed in such a way as the first portions 31 and the second portions 32 thereof are transversly aligned to each other, so that the channel regions of one body stripe never face the channel regions of the adjacent body stripes.

In this way, the distance between adjacent elongated apertures 10 in the insulated gate layer can be significantly reduced without increasing the JFET component of the output resistance of the power device. In fact, considering a generic cross-section transversal to the elongated apertures 10 such as, for example, those shown in FIGS. 2 and 3, it is possible to note that the portion of layer 2 comprised between adjacent body stripes 3 is run through by a current I coming from only one side. Furthermore, it is only necessary to take into account the lateral diffusion of one of two adjacent body stripes 3, because the channel regions of one body stripe (which extend under the insulated gate layer) never face the channel regions of the adjacent body stripes.

Due to this reduction of the distance between adjacent elongated apertures 10 in the insulated gate layer, it is possible to reduce the area of superposition between the gate layer 6 and the drain layer 2 (feedback capacitance decreases) and between the gate layer 6 and the body stripes (input capacitance decreases), with a significant improvement of the dynamic characteristics. Also, a higher number of body stripes can be integrated in a unit chip area, increasing the channel perimeter per unit area, and hence, decreasing the output resistance of the power device.

A source metal layer 9 (not shown in FIG. 1 for the sake of clarity) covers the surface of the chip and contacts the source regions 4 and the body stripes 3 through the elongated apertures 10 in the insulated gate layer.

Figure 4:
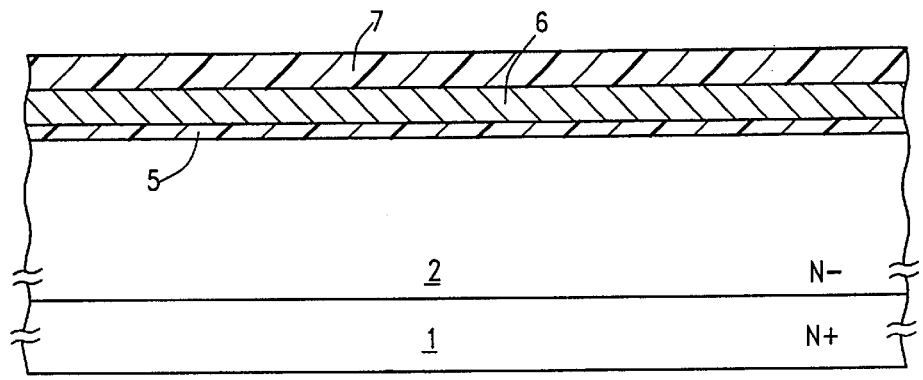
FIGS. 4 to 7 are cross-sectional views taken along line II—II of FIG. 1 showing the MOS technology power device according to the first embodiment of the invention at intermediate steps of a manufacturing process thereof.

For the manufacturing of the MOS technology power device according to the first embodiment of the invention, N– layer 2 is formed over the silicon substrate 1, generally by means of epitaxial growth. After having defined in a conventional way active area regions over the surface of layer 2, gate oxide layer 5 is formed, for example by means of thermal oxide growth, over the surface of layer 2 in the active areas; polysilicon layer 6 is then deposited over gate oxide layer 5, and it is doped for increasing its conductivity; insulating material layer 7 is then deposited over polysilicon layer 6 (FIG. 4).

Figure 5:
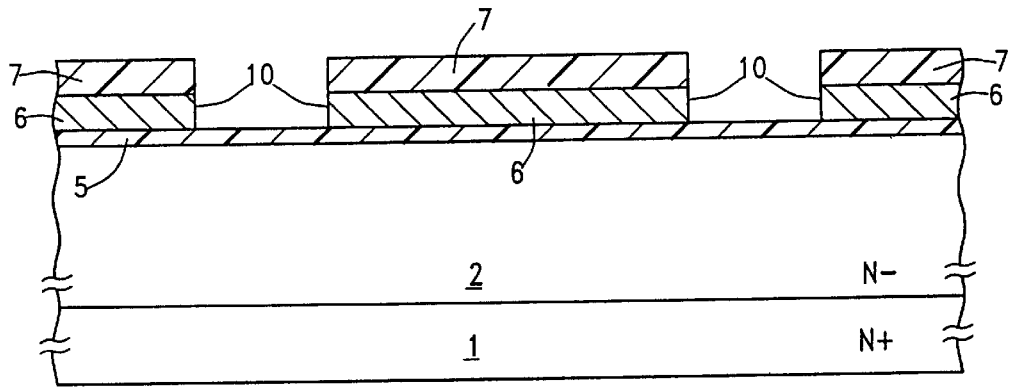

By means of selective etching, rectilinear elongated windows 10 are then formed in the insulating layer 7 and polysilicon layer 6 down to the gate oxide layer 5 (FIG. 5).

Figure 6:
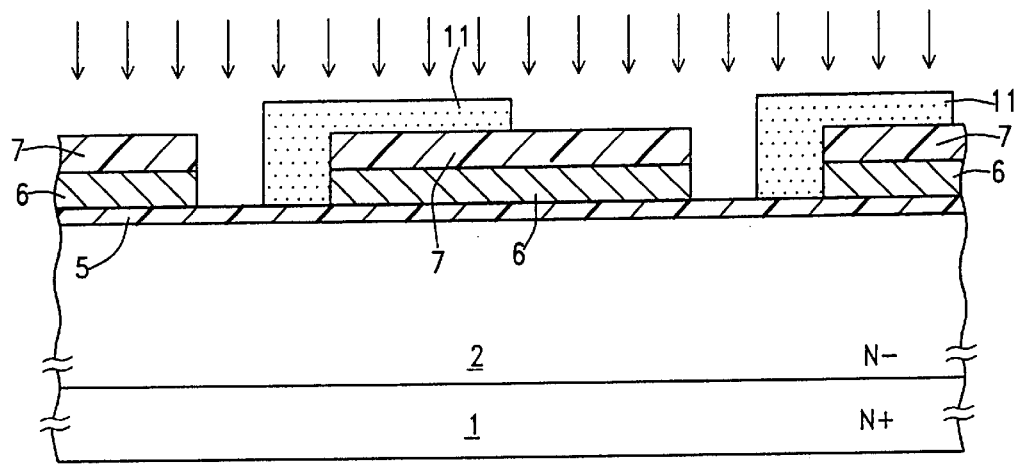
Figure 8:
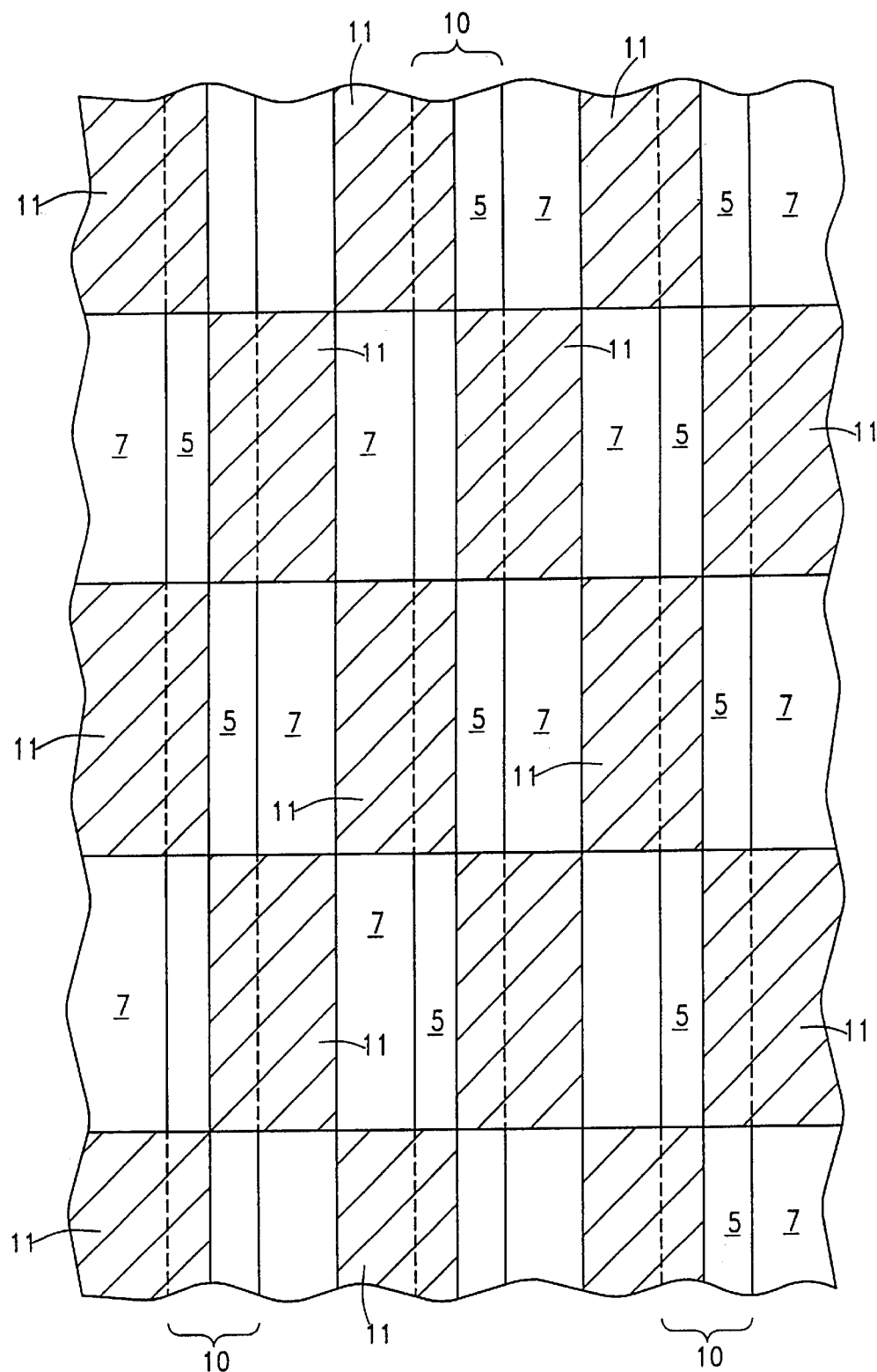
FIG. 8 is a top-plan view of the portion of MOS technology power device of FIG. 1 at a step of the manufacturing process corresponding to FIG. 6.

A photoresistant layer 11 is then deposited over the whole surface of the chip, and is selectively etched (by means of a dedicated mask) to form an implantation mask layer having substantially a checkerboard layout shown in FIG. 8. A high-diffusivity P type dopant, such as boron, and an N type dopant with lower diffusivity, such as arsenic, are then implanted in respective doses of $10^{13}$ to $10^{14}$ ions/cm$^2$ and $10^{15}$ to $10^{16}$ ions/cm$^2$ through the mask layer formed by photoresistant layer 11 (FIG. 6).

Figure 7:
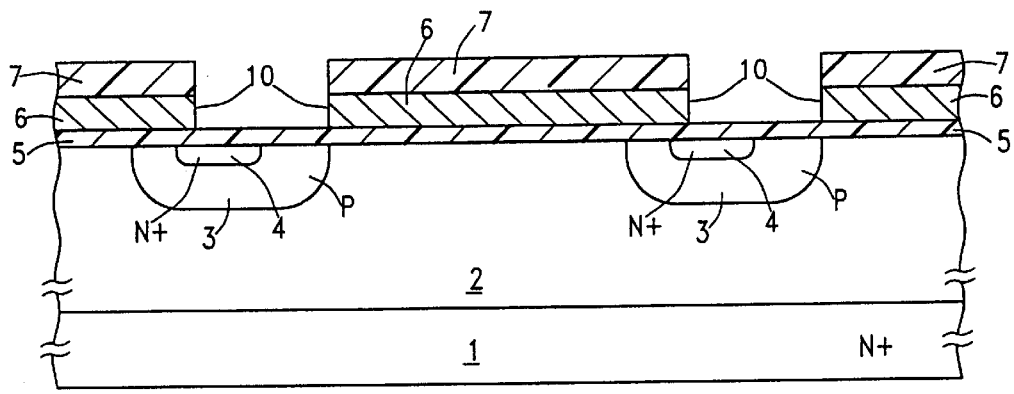

A thermal treatment is then executed, for example submitting the chip to a temperature of 1000 to 1150 C. for approximately 10 minutes to 2 hours, to make the dopants diffuse. As is known, boron has a higher diffusivity than arsenic, so that the former diffuses laterally and vertically to a greater extent than the latter; N+ source regions 4 can thus be formed internally to P type body stripes 3 (FIG. 7). As shown in FIG. 6, the mask layer covers half of the aperture 10 in the insulated gate layer, after dopant diffusion the P type body stripes extend under the gate oxide layer 5 only at one side, while at the other side they are substantially aligned to the wall of the apertures 10.

Insulating spacers 8 are then formed at the vertical walls of the elongated openings 10 in the insulating and polysilicon layers 7 and 6, and the gate oxide layer 5 is removed from over the body stripes 3 to define contact windows. The source metal layer 9 is then deposited over the surface of the chip, so that the source metal layer can contact the body stripes 3 and the source regions 4.

Figure 9:
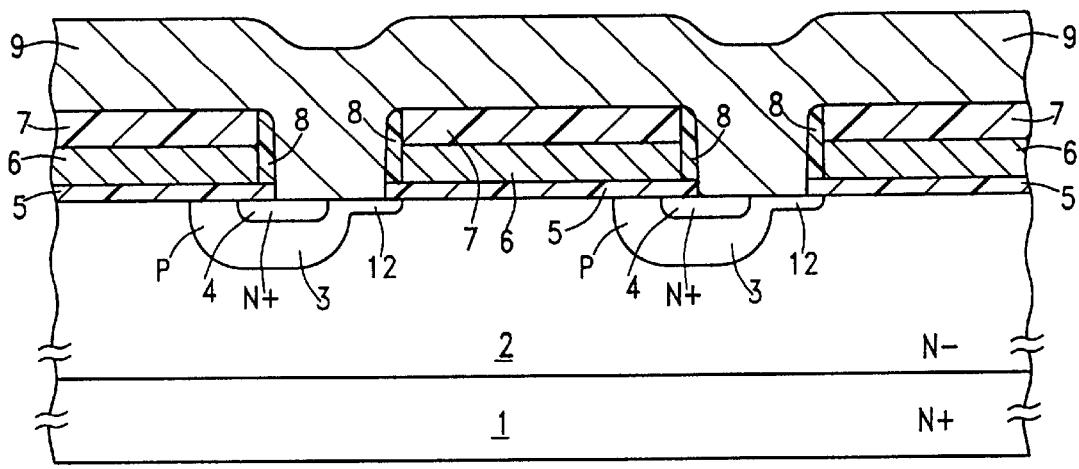
FIGS. 9 and 10 are cross-sectional views respectively similar to those of FIGS. 2 and 3 showing a MOS technology power device according to a second embodiment of the invention.
Figure 10:
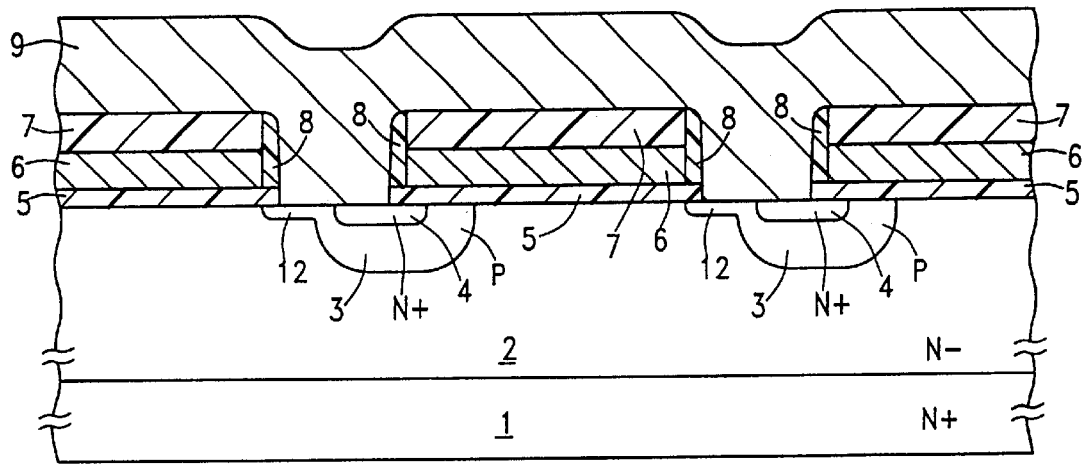

FIGS. 9 and 10 show, in cross-sectional views similar to those of FIGS. 2 and 3, a MOS technology power device according to a second embodiment of the invention. Different from the previous embodiment, additional P type regions 12, preferably shallower than the source regions 4 and with doping level of approximately $10^{17}$ to $10^{19}$ atoms/cm$^3$, are formed along the sides of the portions 31 and 32 of the body stripes 3 which do not extend significantly under the insulated gate layer, that is, the sides of portions 31 and 32 opposite to the sides wherein the source regions 4 are formed. P type regions 12 ensure that the source metal layer 9 does not contact the N– layer 2, what would cause a short-circuit between source and drain of the power device. P type regions 12 also reduces the base resistance ($r_{bb}$) of parasitic bipolar transistor having emitter, base and collector respectively formed by N+ source regions 4, P type body regions 3 and N– layer 2, which is intrinsically associated to the power MOSFET structure.

Figure 11:
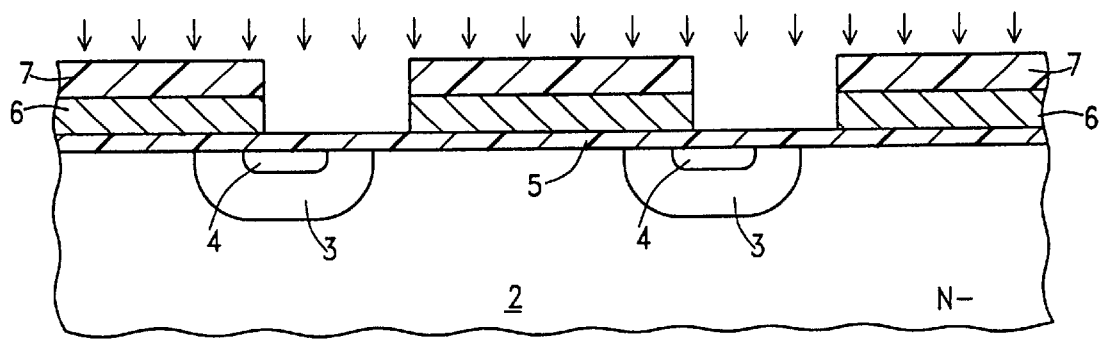
FIGS. 11 and 12 are cross-sectional views showing two steps of a process for manufacturing the MOS technology power device according to the second embodiment of the invention.
Figure 12:
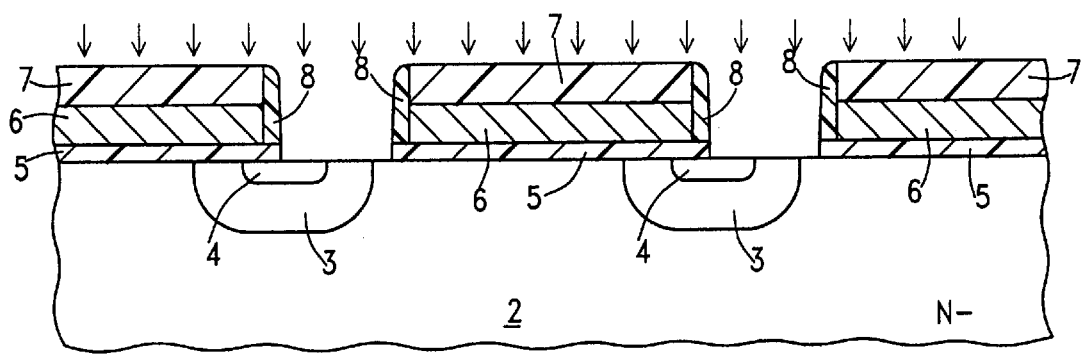

For the manufacturing of the MOS technology power device according to the second embodiment of the invention, the same manufacturing process previously described is suitable; it is only necessary to add an implantation step of a P type dopant, such as for example boron in a dose of $10^{14}$ to $10^{15}$ ions/cm$^2$. Such additional implantation step can be performed after the thermal diffusion process of the dopants forming the body stripes 3 and the source regions 4 (FIG. 11), followed by an additional thermal diffusion process, or prior to the formation of the body stripes 3 and source regions 4, provided that a dopant with lower diffusivity than those used for the body stripes and source regions is utilized. Also, the P type regions 12 can be formed after the definition of the contact areas (FIG. 12). No dedicated mask is required, provided that the doping level of regions 12 is lower than that of source regions 4: the implantation mask is provided by the insulated gate layer.

Figure 13:
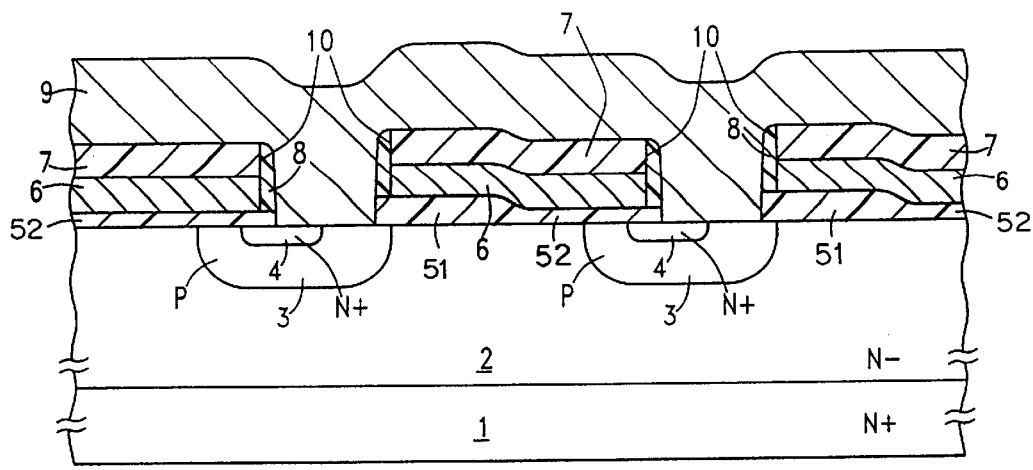
FIGS. 13 and 14 are cross-sectional views respectively similar to those of FIGS. 2 and 3 showing a MOS technology power device according to a third embodiment of the invention.
Figure 14:
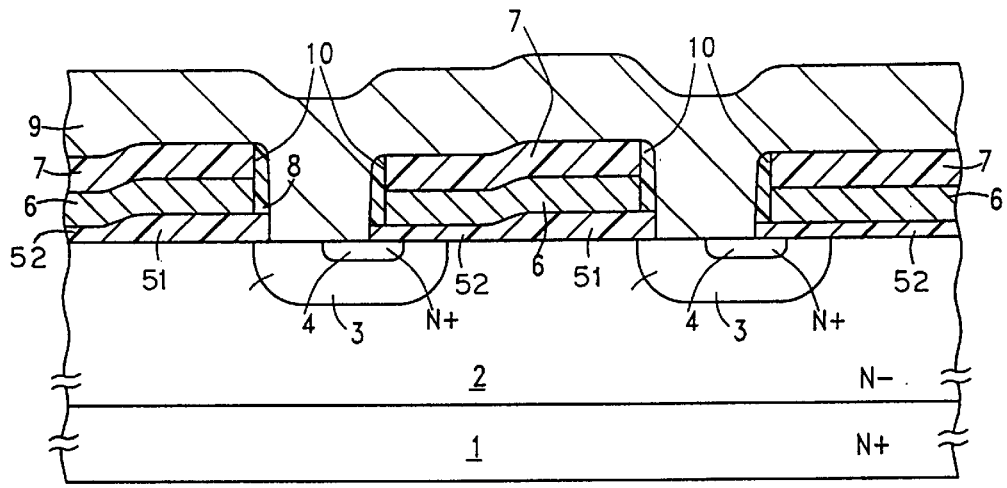

FIGS. 13 and 14 show, in cross-sectional views similar to those of FIGS. 2 and 3, a MOS technology power device according to a third embodiment of the present invention. Different from the structures according to the first and second embodiment, the insulated gate layer does not comprise a gate oxide layer 5 with a uniform thickness over the portions of layer 2 disposed between the body stripes 3. In fact, as visible, the insulated gate layer comprises an oxide layer with portions 52, having thickness substantially equal to that of the gate oxide layer 5 in the structure of FIG. 2, extending from the sides of the portions 31, 32 of the body stripes which extends under the insulated gate layer to form the channel regions to approximately half the distance from the adjacent body stripes, and portions 51 of greater thickness (approximately 100 to 300 nm) extending from the side of the body stripes 3 which are substantially aligned with the walls of the elongated openings 10 to approximately half of the distance from the adjacent body stripes 3.

This structure allows to further reduce the feedback capacitance of the power device, because where it is not strictly necessary for the formation of a conductive channel, the gate layer 6 is separated from the drain layer 2 by an oxide layer 51 thicker than the gate oxide layer 52.

Figure 15:
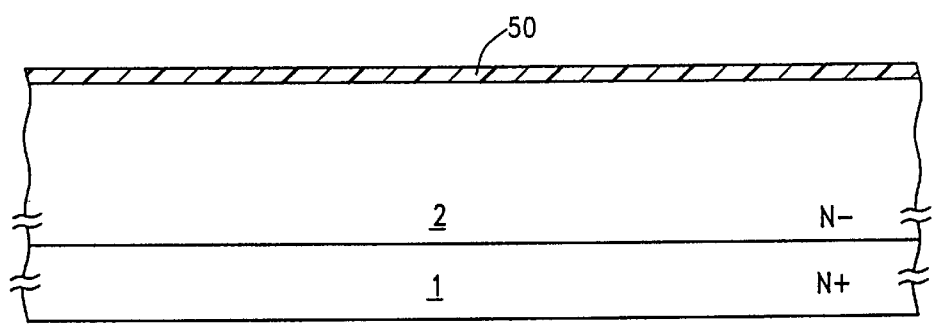
FIGS. 15 to 20 are cross-sectional views showing the MOS technology power device according to the third embodiment of the invention at intermediate steps of a manufacturing process thereof.

For the manufacturing of a MOS technology power device according to the third embodiment of the invention, after the N– layer 2 has been epitaxially grown over the N+ substrate 1 and active areas have been defined over the surface of layer 2, an oxide layer 50 having thickness of approximately 100 to 300 nm is formed over the surface of layer 2 in the active areas (FIG. 15).

Figure 16:
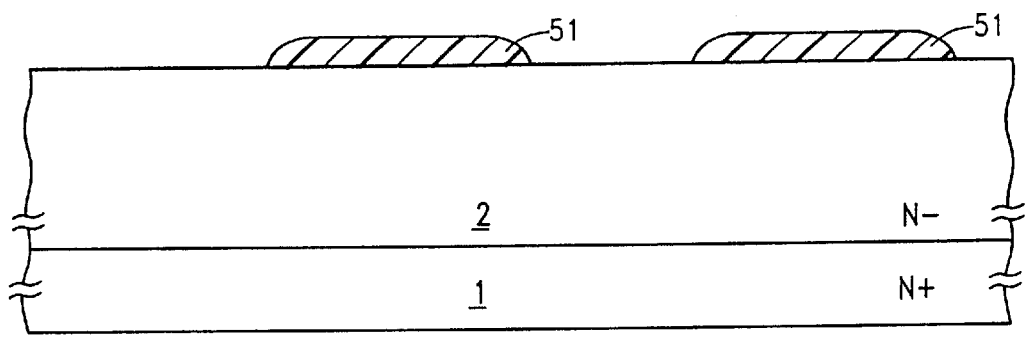

As shown in FIG. 16, oxide layer 50 is then selectively removed from the surface of layer 2, for example by means of wet etching techniques, to form the portions 51 of oxide layer shown in FIGS. 13 and 14.

Figure 17:
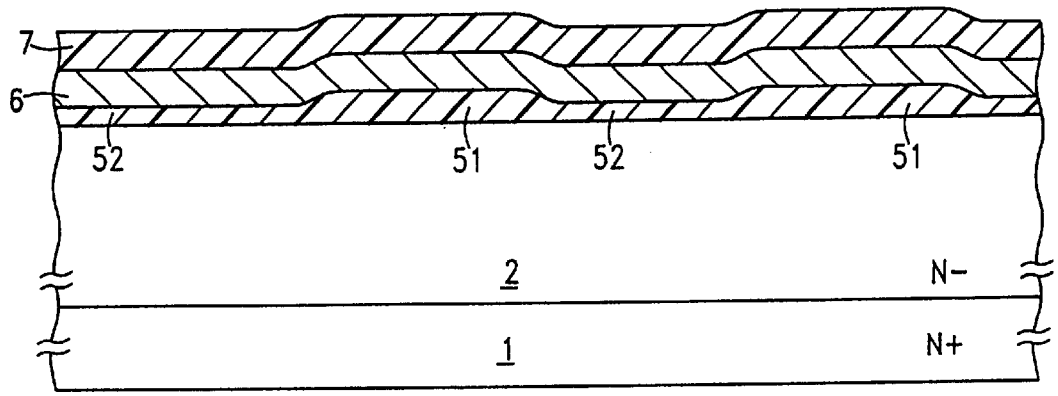

With reference to FIG. 17, portions 52 of a thinner gate oxide layer with thickness of 10 to 100 nm are then formed over the surface of layer 2 between the thicker oxide portions 51, and a polysilicon layer 6 is formed over the oxide layers 51 and 52. The polysilicon layer 6 is then doped to increase its conductivity. An insulating material layer 7 is deposited over the polysilicon layer 6.

Figure 18:
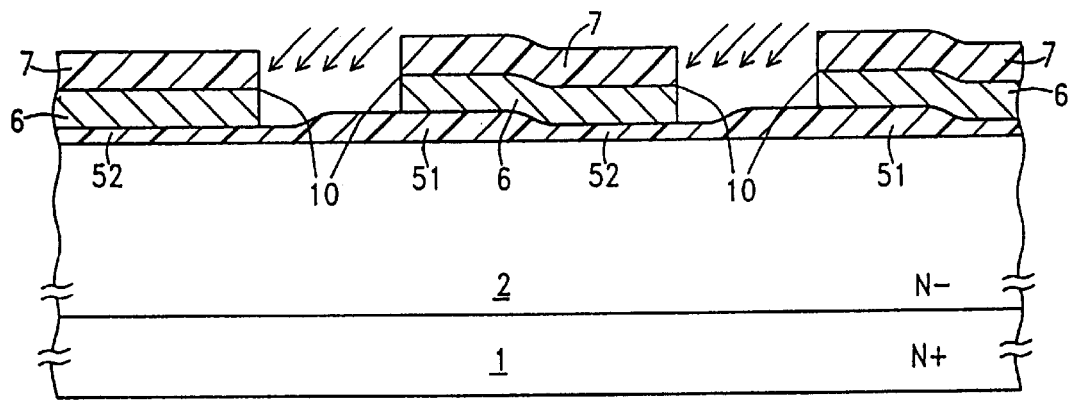

With reference to FIG. 18, the insulating layer 7 and the underlying polysilicon layer 6 are then selectively removed down to the oxide layer portions 51 and 52 to open rectilinear elongated windows 10; inside windows 10, the surface of layer 2 is left covered by oxide layers 51 and 52. A P type dopant, such as boron, is then implanted in a dose of $10^{13}$ to $10^{14}$ ions/cm$^2$ and at an energy in the range 100–200 KeV, at an implantation angle with respect to the orthogonal direction to the surface of layer 2 such that the shadow area determined by layers 6 and 7 is less then the lateral diffusion of the dopant during a subsequent thermal process; the implantation energy is such that the peak of the dopant concentration after the implant is located at approximately 0.3–0.5 um from the surface of layer 2; the thickness of the oxide layer 51 shall be not too high to prevent masking of the P type dopant during implantation.

Figure 19:
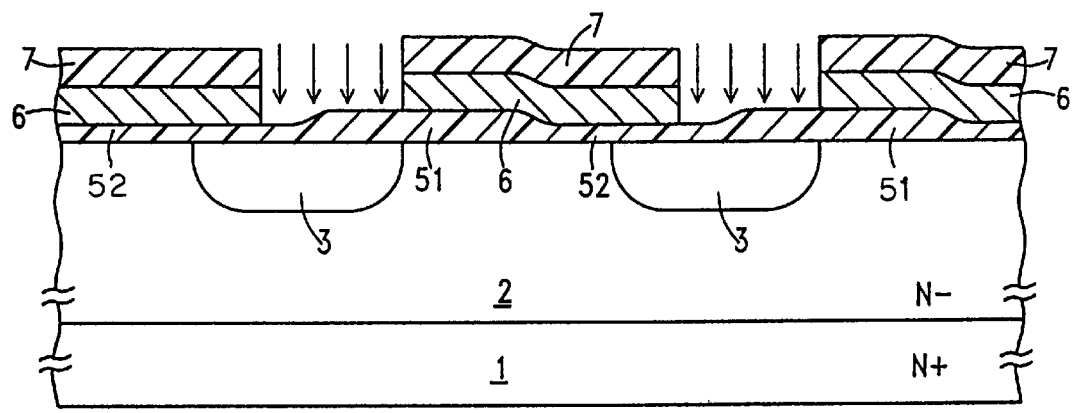

With reference to FIG. 19, after execution of a thermal treatment to make the P type dopant diffuse and form the P type body stripes 3, an N type dopant such as arsenic is implanted orthogonally to the surface of layer 2, in a dose of approximately $10^{15}$ to $10^{16}$ ions/cm$^2$ and at an energy sufficiently to make the dopant pass through the thinner oxide layer 52 but not through the thicker oxide layer 51; the thickness of oxide layer 51 must therefore be sufficiently high to mask the N type dopant implantation.

Figure 20:
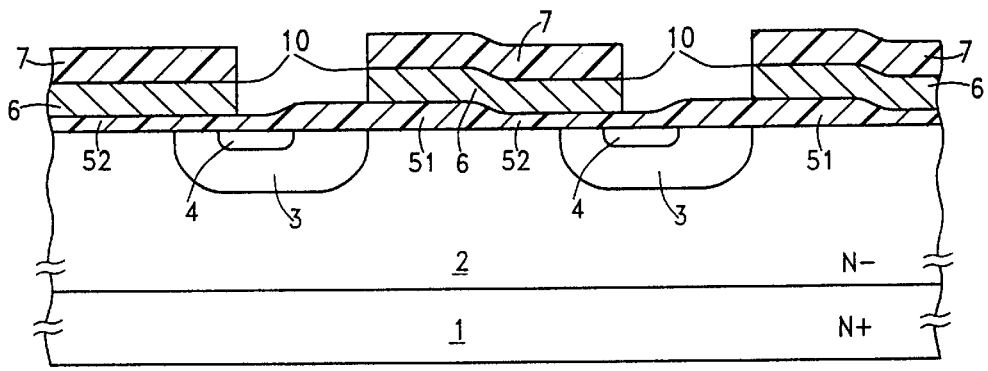

Another thermal treatment is then executed to make the N type dopant diffuse to form the N+ source regions 4 (FIG. 20).

Sidewall spacers 8 of insulating material are then formed at the vertical walls of elongated windows 8, and the oxide layers 51 and 52 inside the elongated windows 10 are then removed by means of a dry etching process; the thickness of oxide layer 51 should not be too high not to hamper the etching process. Source metal layer 9 is then deposited over the surface of the chip.

The final structure has a layout similar to that shown in FIG. 1, with asymmetric body stripes; however, as already mentioned, this structure is more advantageous from the point of view of the dynamic performance.

Figure 21:
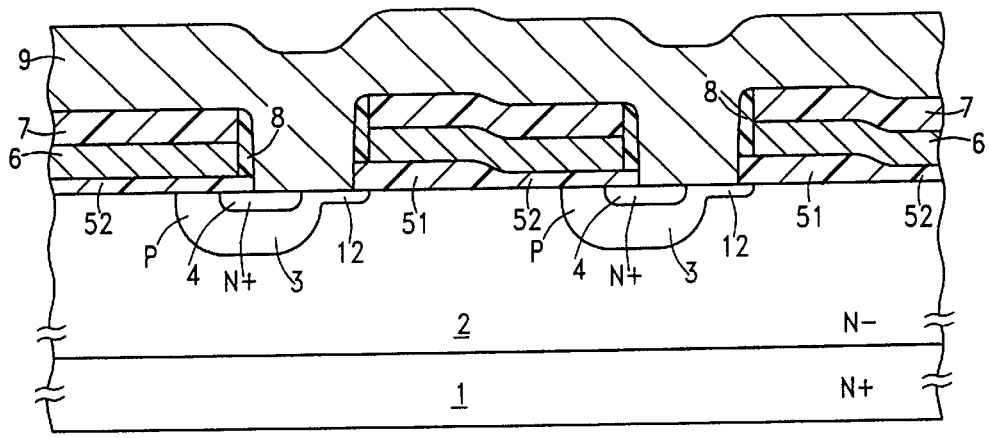
FIGS. 21 and 22 are cross-sectional views respectively similar to those of FIGS. 2 and 3 showing a MOS technology power device according to a fourth embodiment of the invention.
Figure 22:
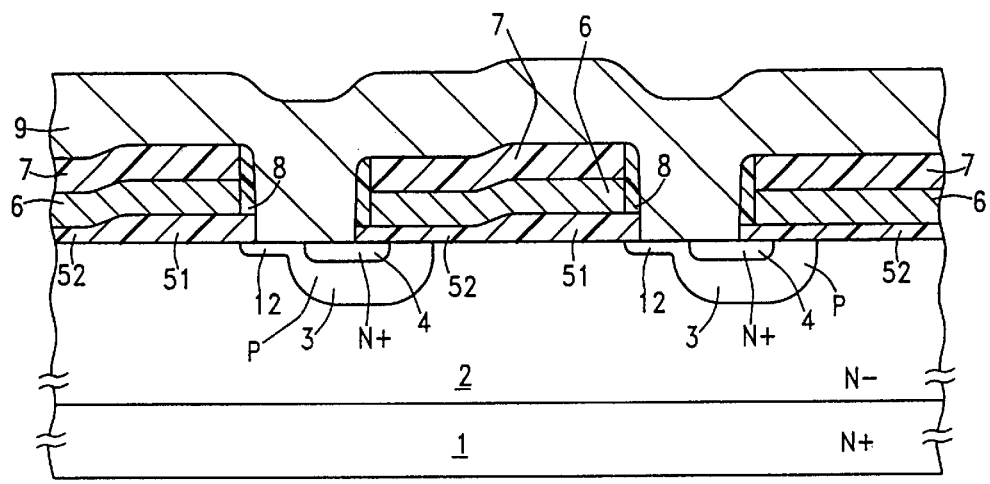

FIGS. 21 and 22 show in cross-sectional views similar to those of FIGS. 2 and 3 a MOS technology power device according to a fourth embodiment of the present invention. This embodiment is quite similar to that shown in FIGS. 13 and 14, but with the addition of P type regions 12 formed along the sides of the portions 31 and 32 of the body stripes 3 which do not extend significantly under the insulated gate layer. As in the second embodiment previously described, P type regions 12 ensure that the source metal layer 9 does not come into contact with the drain layer 2.

A process for the manufacturing the power device of FIGS. 21 and 22 is shown in FIGS. 23 to 26. The process is similar to the last described one up to the definition of the elongated openings 10 in layers 7 and 6.

Figure 23:
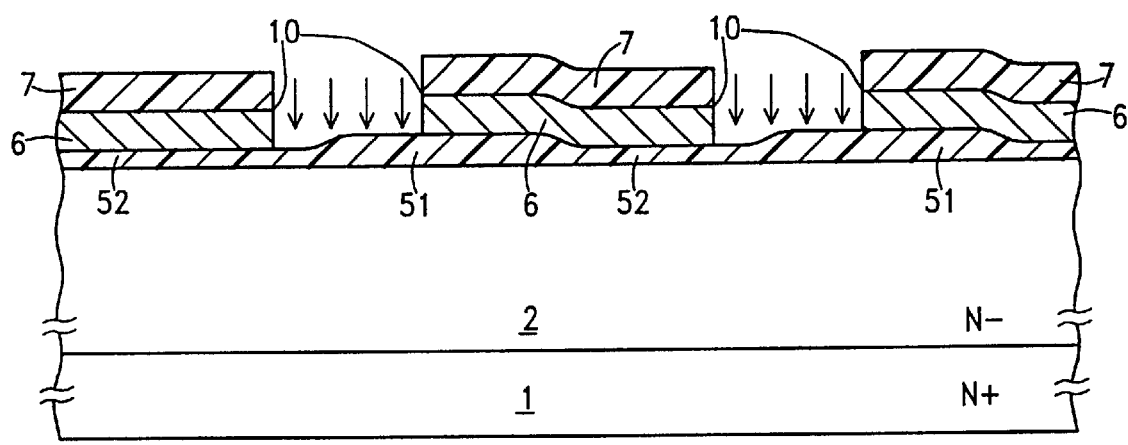
FIGS. 23 to 26 are cross-sectional views showing the MOS technology power device according to the fourth embodiment of the invention at intermediate steps of a manufacturing process thereof.

With reference to FIG. 23, a P type dopant such as, for example, boron, is implanted orthogonally to the surface of layer 2 through windows 10. The P type dopant is implanted in a dose of approximately $10^{13}$ to $10^{14}$ ions/cm$^2$ and at an energy of 30 to 100 KeV; the thickness of oxide portions 51 and the implantation energy of the P type dopant must be such that oxide portions 51 mask the implantation of the P type dopant: the P type dopant is thus implanted in layer 2 only under the portions 52 of thin gate oxide layer.

A thermal treatment is then performed to make the implanted P type dopant diffuse to form the P type body stripes 3. As visible from FIG. 24, under the oxide portions 51 the body stripes do not reach the edge of the elongated openings 10.

Figure 24:
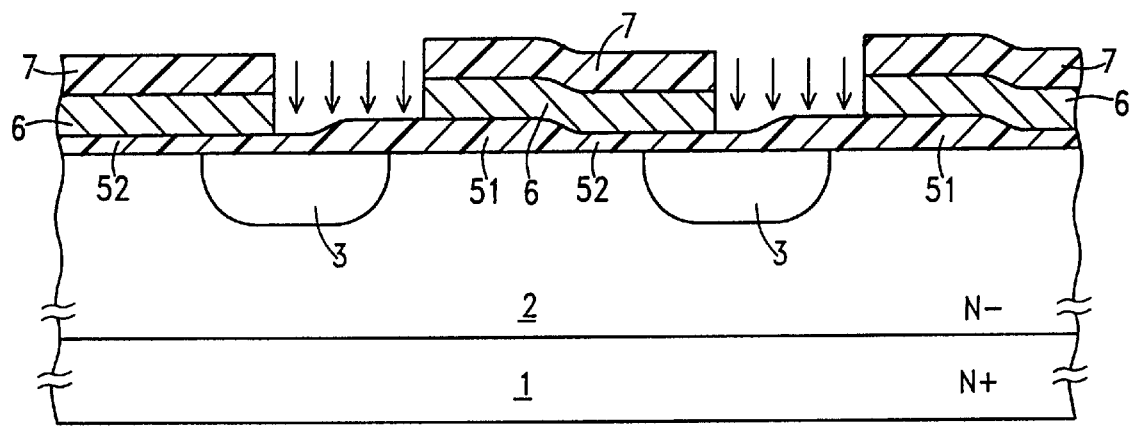

An N type dopant such as, for example, arsenic, is then implanted orthogonally in a dose of approximately $10^{15}$ to $10^{16}$ ions/cm$^2$ and at an energy of 30 to 100 KeV through windows 10. The thickness of oxide portions 51 and the, implantation energy of the N type dopant must be such that oxide portions 51 mask the implantation of the N type dopant (FIG. 24).

Figure 25:
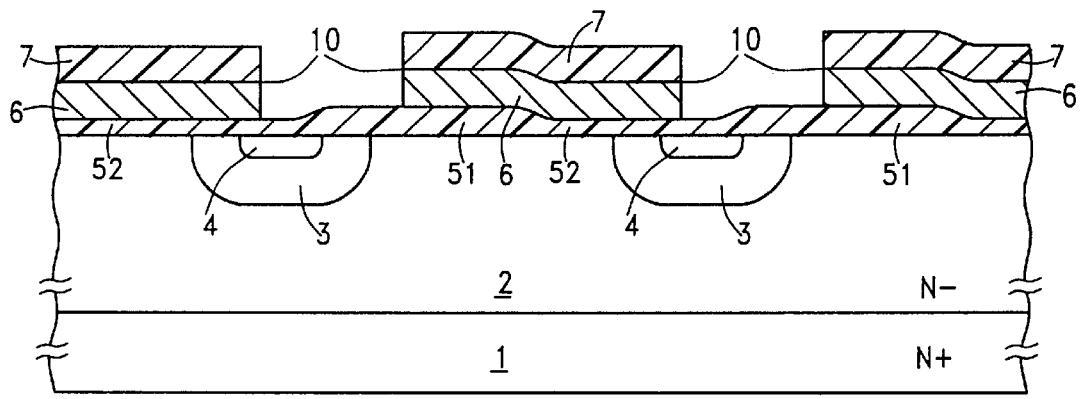

With reference to FIG. 25, a thermal process is then executed to make the implanted N type dopant diffuse, to form the N+ source regions 4.

Figure 26:
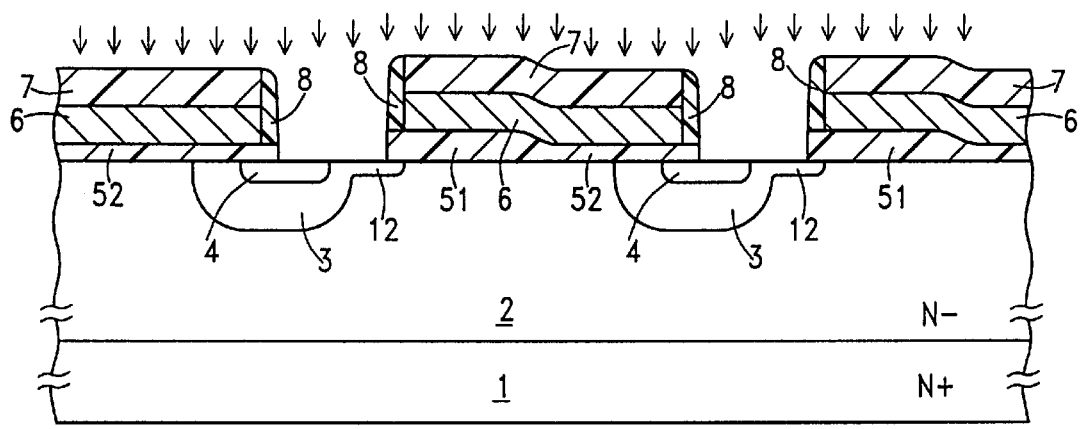

With reference to FIG. 26, insulating material sidewall spacers 8 are then formed at the edges of openings 10, and the oxide layers 51 and 52 are removed from the surface of layer 2 inside the openings 10 to define contact areas to the body stripes 3 and the source regions 4. A P type dopant such as, for example, boron is then implanted in the contact areas in a dose of approximately $10^{14}$ to $10^{15}$ ions/cm$^2$, and it is then made to diffuse to form P type regions 12.

Having thus described at least one illustrative embodiment of the invention, various alterations, modifications, and improvements will readily occur to those skilled in the art. Such alterations, modifications, and improvements are intended to be within the spirit and scope of the invention. Accordingly, the foregoing description is by way of example only and is not intended as limiting. The invention is limited only as defined in the following claims and the equivalents thereto.

What is claimed is:

1. A process for the manufacturing of a MOS technology power device, comprising the steps of:

forming a semiconductor layer of a first conductivity type over a semiconductor substrate;

forming an insulated gate layer over the semiconductor layer;

forming a plurality of substantially rectilinear elongated openings parallel to each other in said insulated gate layer;

forming a respective plurality of elongated body stripes of a second conductivity type in said semiconductor layer under said elongated openings;

forming source regions of the first conductivity type inside said body stripes, and covering the insulated gate layer with a metal layer which contacts the body stripes and the source regions through said elongated openings, wherein said body stripes are formed in such a way as to comprise first portions substantially aligned with a first edge of the respective elongated openings and extending under a second edge of said elongated opening to form a channel region, each first portion including a source region extending substantially from a longitudinal axis of symmetry of said respective elongated opening to said second edge of the elongated opening, and second portions, longitudinally intercalated with said first portions, substantially aligned with the second edge of the elongated opening and extending under the first edge of the elongated opening to form a channel region, each second portion including a source region extending substantially from said longitudinal axis of symmetry to said first edge of the elongated opening, said first portions and second portions of the body stripes being respectively aligned in a direction transversal to said longitudinal axis.

2. The process according to claim 1, wherein said body stripes and said source regions are formed by means of respective selective implantation of dopants through a same masking layer superimposed over the insulated gate layer, said masking layer having apertures therein forming a checkerboard pattern over each of said elongated openings in the insulated gate layer.

3. The process according to claim 2, wherein a first dopant forming the body stripes has, in said semiconductor layer, a higher diffusivity than a second dopant forming the source regions, so that during a thermal diffusion treatment following said implantation of dopants the first dopant diffuses more than the second dopant.

4. The process according to claim 3, further comprising the steps of implanting a third dopant of the second conductivity type for forming superficial enrichment regions of the second conductivity type extending substantially from said longitudinal axis of symmetry of the elongated openings to the first edge of the elongated openings in said first portions of the body stripes, and from the longitudinal axis of symmetry to the second edge of the elongated openings in said second portions of the body stripes.

5. The process according to claim 4, wherein said third dopant is implanted after the thermal diffusion treatment of the first and second dopant.

6. The process according to claim 5, wherein said third dopant is implanted through said elongated apertures in the insulated gate layer.

7. The process according to claim 1, further comprising the steps of:

forming over the semiconductor layer a first oxide layer having a first thickness;

selectively removing the first oxide layer to leave first oxide layer portions forming a checkerboard pattern over the semiconductor layer;

forming a second oxide layer portions having a second thickness over the semiconductor layer wherein said first oxide layer has been removed, the second thickness being lower than the first thickness;

forming over the first and second oxide layer portions a polysilicon gate layer;

forming an insulating layer over the polysilicon gate layer;

selectively etching the insulating layer and the polysilicon gate layer to form said plurality of substantially rectilinear parallel elongated openings, said elongated openings having a first edge and a second edge and comprising first portions wherein the semiconductor layer is covered from said first edge to the longitudinal axis of symmetry by said first oxide layer portions and from the longitudinal axis of symmetry to the second edge by said second oxide layer portions, longitudinally intercalated with second portions wherein the semiconductor layer is covered from said first edge to the longitudinal axis of symmetry by said second oxide layer portions and from the longitudinal axis of symmetry to the second edge by said first oxide layer portions;

implanting a first dopant of a first conductivity type along directions lying in a plane transversal to said elongated openings and slanted with respect to a direction orthogonal to a surface of the semiconductor layer at an energy sufficient to make the first dopant penetrate through the first oxide layer portions;

diffusing the first dopant to form said body stripes;

implanting a second dopant of the first conductivity type having a diffusivity in the semiconductor layer lower than a diffusivity of the first dopant, at an energy sufficient to make the first dopant penetrate through the second oxide layer portions but not through the first oxide layer portions, and diffusing the second dopant to form said source regions;

forming insulating sidewall spacers at the edges of said elongated openings;

removing the first and second oxide layer portions from the surface of the semiconductor layer under said elongated openings to form elongated contact windows; and forming a metal layer over the insulating layer.

8. The process according to claim 1, further comprising the steps of:

forming over the semiconductor layer a first oxide layer having a first thickness;

selectively removing the first oxide layer to leave first oxide layer portions forming a checkerboard pattern over the semiconductor layer;

forming a second oxide layer portions having a second thickness over the semiconductor layer wherein said first oxide layer has been removed, the second thickness being lower than the first thickness;

forming over the first and second oxide layer portions a polysilicon gate layer;

forming an insulating layer over the polysilicon gate layer;

selectively etching the insulating layer and the polysilicon gate layer to form said plurality of substantially rectilinear parallel elongated openings, said elongated openings having a first edge and a second edge and comprising first portions wherein the semiconductor layer is covered from said first edge to the longitudinal axis of symmetry by said first oxide layer portions and from the longitudinal axis of symmetry to the second edge by said second oxide layer portions, longitudinally intercalated with second portions wherein the semiconductor layer is covered from said first edge to the longitudinal axis of symmetry by said second oxide layer portions and from the longitudinal axis of symmetry to the second edge by said first oxide layer portions;

implanting a first dopant of the second conductivity type orthogonally to a surface of the semiconductor layer at an energy sufficiently high to make the first dopant penetrate though the second oxide layer portions but not through the first oxide layer portions;

diffusing the first dopant to form said body stripes;

implanting orthogonally to said surface of the semiconductor layer a second dopant of the first conductivity type having a diffusivity in the semiconductor layer lower than a diffusivity of the first dopant, at an energy sufficiently high to make the second dopant penetrate through the second oxide layer portions but not through the first oxide layer portions;

diffusing the second dopant;

forming insulating sidewall spacers at the edges of said elongated openings;

removing the first and second oxide layer portions from the surface of the semiconductor layer under said elongated openings;

implanting a third dopant of the second conductivity type through said elongated openings and diffusing the third dopant for forming superficial enrichment regions of the second conductivity type extending substantially from said longitudinal axis of symmetry of the elongated openings to the first edge of the elongated openings in said first portions of the body stripes, and from the longitudinal axis of symmetry to the second edge of the elongated openings in said second portions of the body stripes;

forming a metal layer over the insulated gate layer.

* * * * *